United States Patent
Mäkinen et al.

(10) Patent No.: US 6,307,445 B1
(45) Date of Patent: Oct. 23, 2001

(54) IMPEDANCE MATCH OF TRANSMISSION LINES HAVING A CONNECTION ARRANGEMENT FOR SELECTING IMPEDANCE

(75) Inventors: Olli-Pekka Mäkinen; Jouni Pyyhkälä, both of Vantaa; Timo Pasanen, Espoo, all of (FI)

(73) Assignee: Nokia Networks Oy, Espoo (FI)

(*) Notice: Subject to any disclaimer, the term of this patent is extended or adjusted under 35 U.S.C. 154(b) by 0 days.

(21) Appl. No.: 09/479,301

(22) Filed: Jan. 6, 2000

Related U.S. Application Data

(63) Continuation of application No. PCT/FI98/00582, filed on Jul. 9, 1998.

(30) Foreign Application Priority Data

Jul. 9, 1997 (FI) .......................................... 972926
Jul. 9, 1997 (FI) .......................................... 972927

(51) Int. Cl.$^7$ ................................................ H03H 7/38
(52) U.S. Cl. .................... 333/32; 333/1; 333/24 R
(58) Field of Search .............................. 333/32, 124, 1, 333/260, 24 R

(56) References Cited

U.S. PATENT DOCUMENTS

| | | | |
|---|---|---|---|
| 5,017,818 | 5/1991 | Dohogne | 439/217 X |
| 5,771,262 | 6/1998 | Benayoun et al. | 333/17.3 X |
| 5,896,417 * | 4/1999 | Lau | 333/32 X |

FOREIGN PATENT DOCUMENTS

| | | |
|---|---|---|
| 0 240 454 | 10/1987 | (EP) . |
| 0 258 029 | 3/1988 | (EP) . |
| 95182 | 10/1992 | (FI) . |
| 6275346 | 9/1994 | (JP) . |
| 7212168 | 8/1995 | (JP) . |
| 8107325 | 4/1996 | (JP) . |
| 8123593 | 5/1996 | (JP) . |
| 8195637 | 7/1996 | (JP) . |
| 94/10750 | 5/1994 | (WO) . |

\* cited by examiner

*Primary Examiner*—Benny Lee
(74) *Attorney, Agent, or Firm*—Altera Law Group, LLC

(57) ABSTRACT

The invention relates to a circuit arrangement for forming an impedance match of transmission lines. The circuit arrangement includes a control state (11), a dynamic input impedance formed by resistances and a transformer (13) provided with primary and secondary coils. The control stage (11) and the input impedance are connected to the poles of the transformer's (13) secondary coil, and transmission lines having mutually different characteristic impedances are connected one at a time to the poles of the transformer's (13) primary coil. According to the invention, the circuit arrangement is characterised in that for forming a resistive input impedance the circuit arrangement includes a processor (15) and means (14) for implementing the match.

4 Claims, 5 Drawing Sheets

IMPEDANCE MATCH OF TRANSMISSION LINES HAVING A CONNECTION ARRANGEMENT FOR SELECTING IMPEDANCE

This application is a continuation of international application serial number PCT/FI98/00582, filed 9 July 1998.

FIELD OF THE INVENTION

This invention relates to a circuit arrangement for forming an impedance match of transmission lines. The circuit arrangement includes a control stage, a dynamic input impedance formed by resistances and a transformer provided with primary and secondary coils. The control stage and the input impedance are connected to the poles of the transformer's secondary coil while transmission lines all with a different characteristic impedance are connected one by one to the poles of the transformer's primary coil.

BACKGROUND OF THE INVENTION

In PCM systems, signals can be conducted from and to a transmission unit either e.g. on an E1 line in accordance with the European standard or e.g. on a T1 line in accordance with the American standard. The E1 line can be e.g. a 75 Ω coaxial cable or a 120 Ω twisted pair cable, while the T1 line may be e.g. a 100 Ω pair cable. Earlier, the circuit board of the transmission unit was only provided to be compatible either with an E1 or with a T1 line, but nowadays the IC circuits on a transmission card are suitable for use both with E1 and T1 lines, whereby both these lines can be wired to the circuit board and either line may be chosen for electric connection to the transmission circuit.

In the transmission unit of a PCM system, e.g. in the transmitter/receiver transmission unit of a Pan-European GSM mobile communications system, the transmission circuit board must be matched to the characteristic impedance of the transmission cable used to bring about the desired signal and impedance levels. For example, cables of the E1 line or T1 line mentioned above may be used as the transmission line. For matching of different line impedances of a transmission card which is as versatile as possible, it is known to use e.g. a transformer match as the one shown in FIG. 1 in the appended drawing, the primary coil having a center tap that is connected to an operating voltage +V, FIG. 1 illustrates an impedance matching line controller circuit having a control stage 5 for controlling the transmission of a cable, resistors R and a transformer having primary and secondary coils where there is an intermediate output in the secondary coil, whereby a suitable output resistance R of the primary coil is set at different transformation ratios of the transformer T120, T75, TCOMM, for example, a 75 Ω output resistance T75 is set at a transformation ratio of 1:1.26 to be suitable for a 120 Ω cable or at a transformation ratio of 1:1.15 for a 100 Ω cable. It is a problem with this implementation that a big transformer is required.

It is known from patent publication FI-95182 to use a line controller circuit implemented without any separate intermediate output in the secondary coil of the transformer, as shown in FIG. 2 of the appended drawing having similar components to FIG. 1, for the impedance match between the intermediate output circuit and the transmission line. In the line controller circuit of the publication, the output impedances $R_{opt}$ and the transformer's numbers of turns $n_{opt}$, are matched so that the circuit will provide simultaneously the signal level required by two transmission lines each having a different impedance. It is a problem with state-of-the-art impedance matches that it is usually possible to match them simultaneously to be suitable only for two different characteristic transmission line impedances.

SUMMARY OF THE INVENTION

The purpose of this invention is to implement a flexible impedance match for characteristic impedances of different transmission lines, e.g. for impedances of the E1 lines and T1 lines of a PCM system.

This impedance match of a novel type is achieved through such circuit arrangements according to the invention.

The invention is based on the idea that the input impedance of the transmission circuit in a PCM system is chosen to match the characteristic impedance of a transmission line chosen with a digitally controlled analog switch connecting an analog signal. With a connection in parallel of resistances chosen with a suitable analog switch, the input impedance can be matched to several characteristic impedances of different transmission lines in connection with the electric connection of the transmission line to the transmission circuit. In one embodiment of the invention connecting of transmission lines is also performed in a connector part including a connector strip, preferably a pin head connector, and a counterpart which can be attached to it in two different positions. The counterpart in its first position connects to the transmission card only the first twin wire of two twin wires and in its second position it connects only the second one. In its first and second positions the counterpart has the same side against the connector strip. In addition, the second position of the counterpart is achieved by turning the counterpart through 180° in the plane of that side which is against the connector strip. In this way different lines, such as e.g. E1 lines in accordance with the European standard or e.g. T1 lines in accordance with the American standard are separated from each other by a connector strip, and the desired signal routes are short-circuited by a counterpart which is placed on top of the connector strip. The signal routes are changed by turning the counterpart.

It is an advantage of such an impedance match that it is simple and being a single connection it is very stable.

It is an advantage of the impedance match and of the connection arrangement that the connection of desired transmission cables to the transmission circuit is simple. Changing of the cable connection is also easy.

BRIEF DESCRIPTION OF DRAWINGS

The invention will now be described more closely in connection with advantageous embodiments in the appended drawings, wherein.

DETAILED DESCRIPTION OF THE INVENTION

The invention will be described in the following in greater detail in the light of a first embodiment of the invention and referring to FIGS. 3, 4 and 5a–5c.

Figure 3:
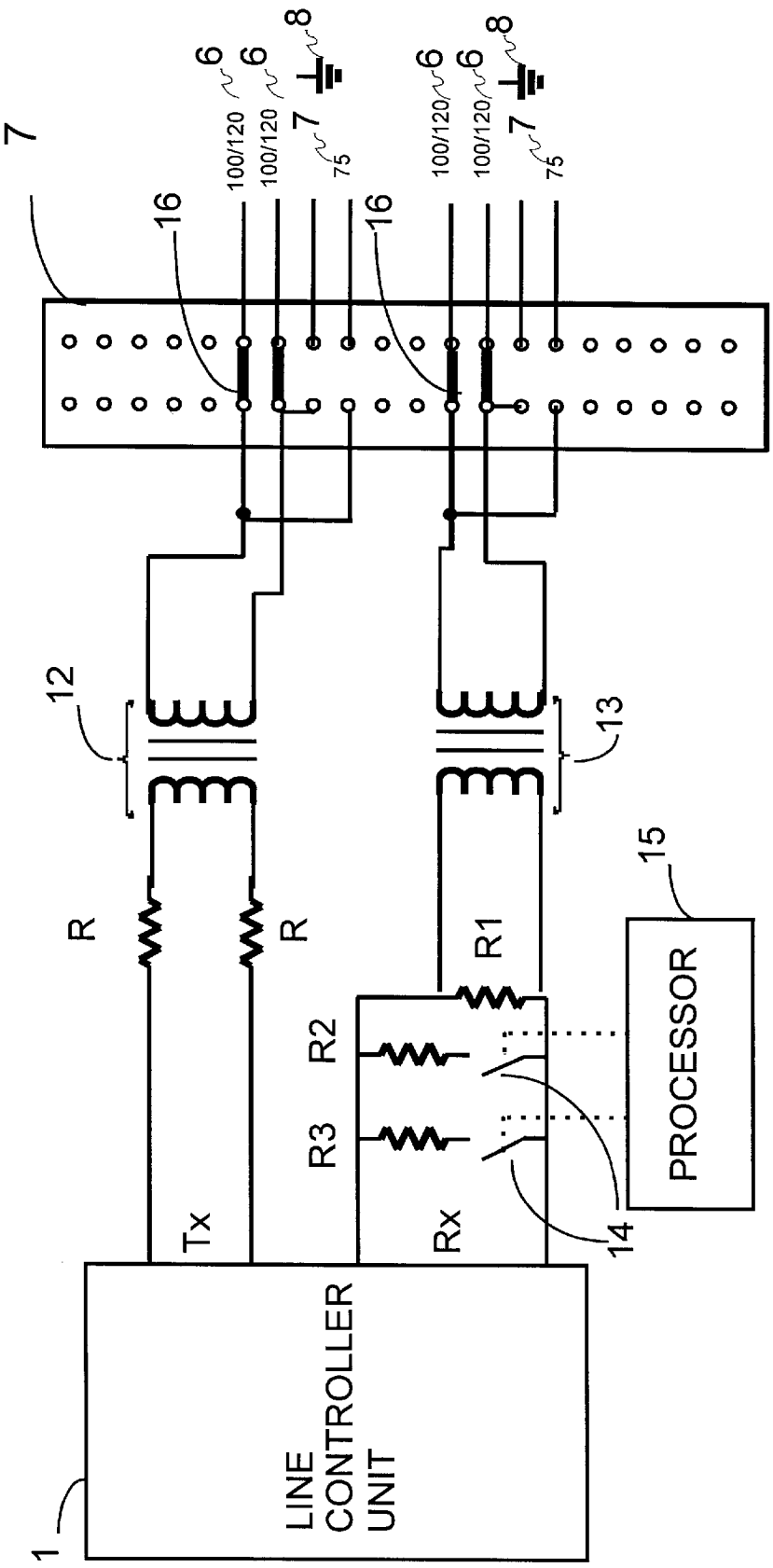
FIG. 3 shows an impedance match according to the invention in connection with a circuit diagram shown as an example.

FIG. 3 shows as an example a circuit diagram of an impedance match of transmission lines to a transmission circuit in accordance with the invention. In the example shown in the figure, the impedance match on the receiving side Rx is chosen with analog switches 14 controlled by a processor 15. In the figure, the connection arrangement 17 is joined to transmission cables coming from outside the transmission unit, which cables are marked with the cable impedance in the case shown in FIG. 3. The connection of symmetrical transmission lines, such as twin cables and twisted-pair cables, is provided in the example shown in FIG. 3 with a 100/120 6 marking, while the connection of asymmetrical transmission lines, such as coaxial cables, with 75 7 and earth potential 8 markings. The presented impedance values are set only as examples in order to illustrate the connections of the connection arrangement 17 according to the invention. Naturally, such cables may also be connected to connection arrangement 17, the impedance of which differs from those presented above. The connection arrangement 17 in FIG. 3 is shown with a connection of the signal route of symmetrical 100/120 Ω cables 6 with the aid of short-circuit strips 16. In the figure, line controller unit 11 connects the lines Tx, Rx with the remaining transmission circuit. The transmission side Tx of the transmission circuit is connected over output resistances R and transformer 12 to connection arrangement 17, which is further connected to reception side Rx of the transmission circuit by way of an impedance match in accordance with the invention. In the following this impedance match will be described more closely with the aid of FIGS. 4 and 5a–5c.

Figure 1:
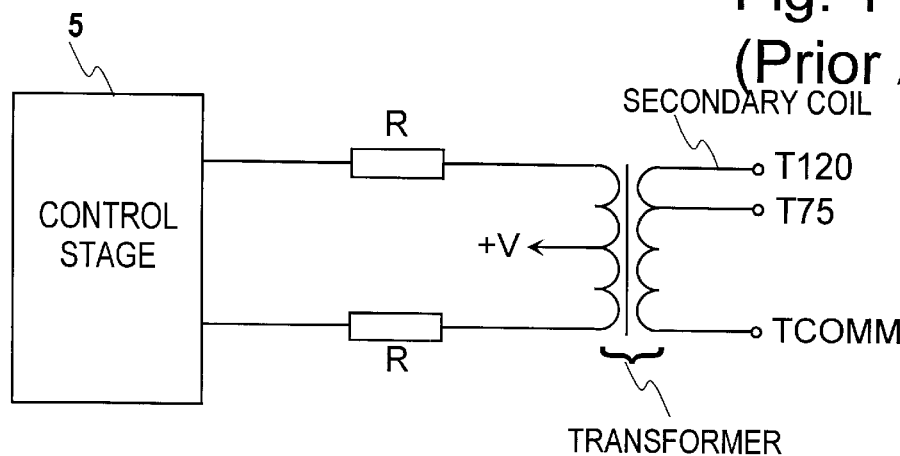
FIG. 1 shows an impedance match circuit implemented with a state-of-the-art intermediate output in the secondary coil of a transformer.
Figure 2:
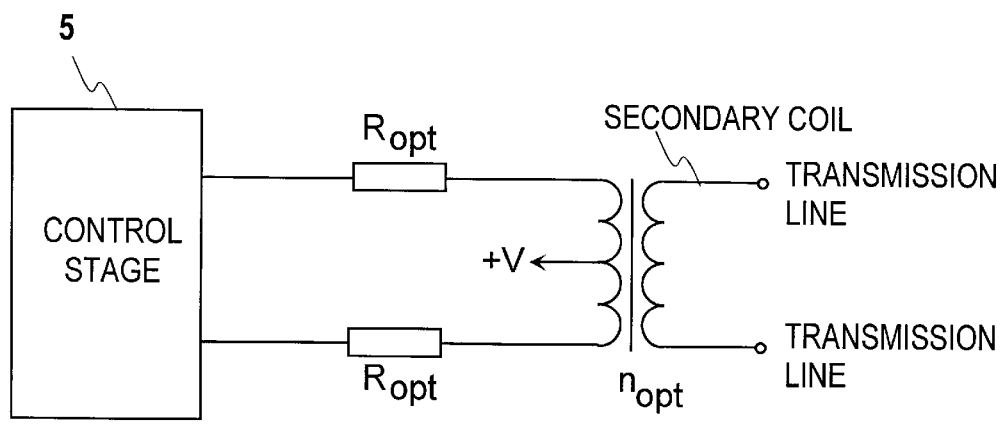
FIG. 2 shows a state-of-the-art line controller circuit matched to two different characteristic impedances of a transmission line.
Figure 4:
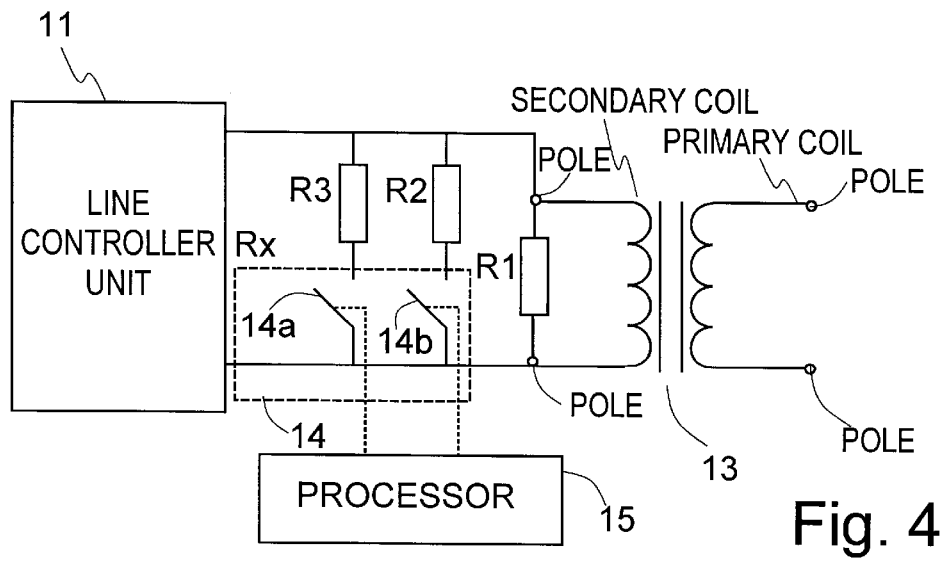
FIG. 4 shows a line controller circuit in accordance with the invention as a circuit diagram.

FIG. 4 is a circuit diagram of the impedance match of a line controller circuit in accordance with the invention. The chosen transmission line is connected to the poles of the primary coil of transformer 13, and the input resistance R1 chosen with switch 14 is connected to the poles of the secondary coil of transformer 13 and, on the other hand, to the input of line controller unit 11. Processor 15 controls switches 14a and 14b of analog switch 14 to connect in parallel resistances R1, R2 and/or R3, which are needed for the impedance match, in order to bring about a resistive input impedance of the line controller circuit in accordance with the invention in a manner to be described later in greater detail with the aid of the examples shown in FIGS. 5a–5c. At different positions of the switch the input impedance is formed by resistance R1, a parallel connection of resistances R1 and R2, a parallel connection of resistances R1 and R3 or possibly also by a parallel connection of resistances R1, R2 and R3. The values of resistances R1, R2 and R3 are chosen to be those required by the characteristic impedance of the transmission line to be matched.

Figure 5A:
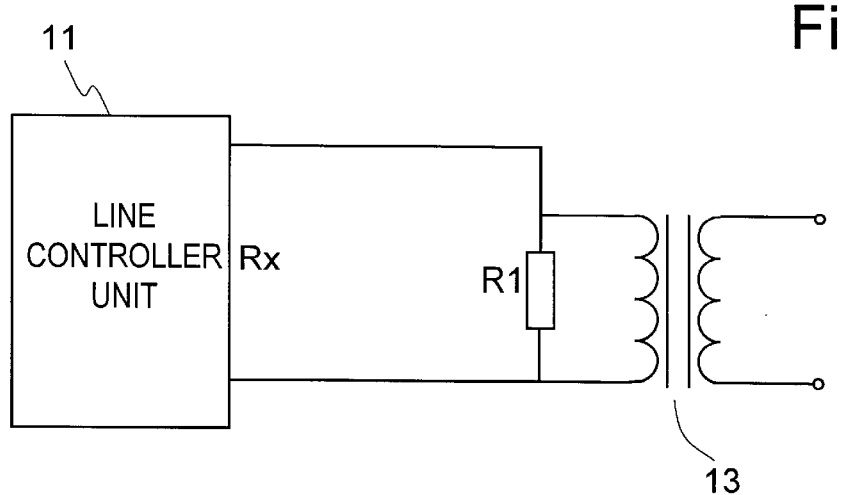
FIGS. 5a, 5b, 5c are circuit diagrams of a line controller circuit according to the invention at different impedance matches.
Figure 5B:
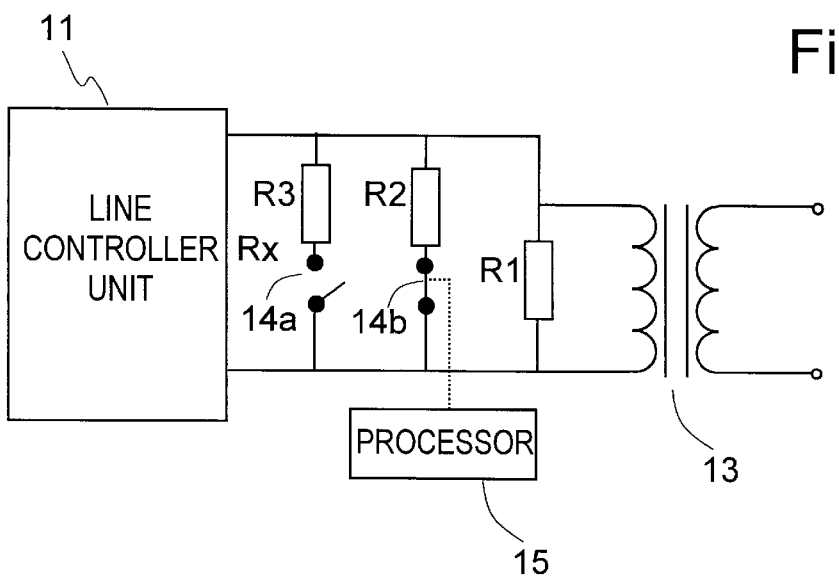
Figure 5C:
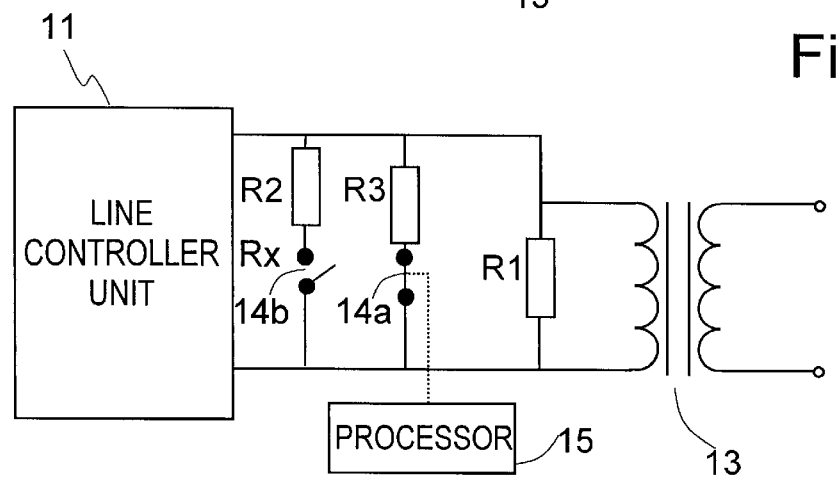

The following is a description as an example and in the light of FIGS. 5a–5c of an impedance match of transmission lines having a characteristic impedance of 75, 100 and 120 Ω respectively in a line controller circuit in accordance with the invention. FIG. 5a shows matching of a 120 Ω transmission line to line controller unit 11. Both switches 14a and 14b shown in FIG. 4 are controlled by processor 15 to their open position, whereby the input impedance of the circuit is formed solely by resistance R1. For example, 121 Ω may be chosen as the value for resistance R1 in order to bring about a match with the 120 Ω characteristic impedance of the transmission line.

FIG. 5b shows matching of a 75 Ω transmission line to line controller unit 11. Processor 15 has then controlled the switch 14b shown in FIG. 4 to its closed position and switch 14a to its open position, whereby the input impedance of the circuit is formed by a connection in parallel of resistances R1 and R2. In order to bring about a match of the characteristic impedance of 75 Ω of the transmission line, e.g. R1=121 Ω and R2=182.2 Ω may be chosen as values for resistances R1 and R2.

FIG. 5c shows matching of a 100 Ω transmission line to line controller unit 11. Processor 15 has then controlled the switch 14a shown in FIG. 4 to its closed position and switch 14b to its open position, whereby the input impedance of the circuit is formed by a connection in parallel of resistances R1 and R3. In order to bring about a match of the characteristic impedance of 100 Ω of the transmission line, e.g. R1=121 Ω and R3=481.2 Ω may be chosen as values for resistances R1 and R3.

For the line controller circuit in accordance with the invention it is advantageous to choose a broadband digitally controlled analog switch which is as stable as possible in regard to frequency, temperature etc. The switch may be e.g. of the MAX392 type which is commercially available. In the line controller circuit, the same transformer may be used for all line types owing to the dynamic adjustment of the input impedance. Transformers 12 and 13 in FIG. 3 are advantageously 1:1 or 1:2 transformers, but it is also possible to use transformers having other transformation ratios.

FIG. 3 shows a connection arrangement 17 which is preferably formed by a connector part including a connector strip, preferably a pin head strip, and a counterpart which can be attached to it in two different positions. In its first position, the counterpart connects a first twin wire to the transmission card and in its second position it connects a second twin wire. In the first and second positions, the counterpart's side against the connector strip is the same. In addition, the second position of the counterpart is achieved y turning the counterpart through 180° in the plane of the side located against the connection strip. Hereby different lines, such as e.g. E1 lines in accordance with the European standard or e.g. T1 lines in accordance with the American standard are separated from each other on the connector strip, and the desired signal routes are short-circuited by the counterpart which is placed on top of the connector strip. Signal routes are changed by turning the counterpart. The counterpart is preferably formed by a short-circuit piece or a connection part and a short-circuit board, such as a circuit board. It is obvious that the impedance match in accordance with the invention is suitable for use also together with some other kind of connection arrangement for transmission lines.

Figure 6A:
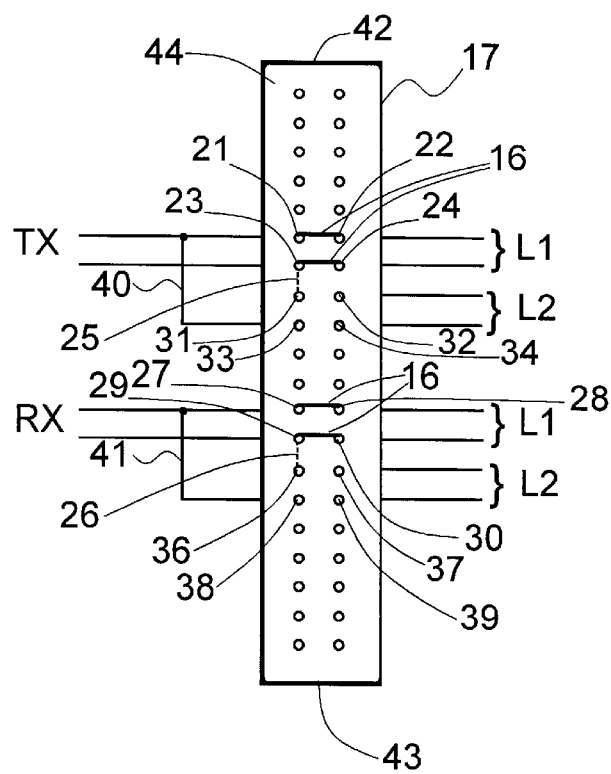
FIGS. 6a and 6b show a connection arrangement according to the invention in its first and second operating positions.

FIG. 6a shows by way of example the first position of a connection arrangement in accordance with an embodiment of the invention in connection with an impedance match of transmission lines, whereby transmission line L1 is electrically connected to transmission line TX and to reception line RX of a transmission circuit. Transmission line L1 is e.g. a symmetrical twin cable. Transmission line TX of the transmission circuit is connected to pins 21 and 23 of a pin line on the transmission circuit side of connection arrangement 17, while correspondingly reception line RX is connected to pins 27 and 29. Of the pins in the pin line on the transmission circuit side of the connection arrangement pins 31 and 33 are also connected to transmission line TX in such a way that pin 31 is connected by wiring 25 to pin 23 while pin 33 is correspondingly connected by wiring 40 to pin 21. In the same manner, pins 36 and 38 are also connected to reception line RX in such a way that pin 36 is connected to pin 29 by wiring 26 and pin 38 is connected to pin 27 by wiring 41. In the case shown as an example in FIG. 6a, the transmission line L1 connected to the transmission unit is wired to pins 22 and 24 of a pin line on the transmission line side of the connection arrangement 17 for transmission to be performed from the transmission circuit, and to pins 28 and 30 for transferring of a signal to the transmission circuit. In the same manner, transmission line L2 is wired to pins 32 and 34 of connection arrangement 17 and also to pins 37 and 39. In the first operating position of the connection arrangement shown in FIG. 6a, short-circuit strips 16 are located between pins 21 and 22 and also between pins 23 and 24 in order to connect transmission line L1 electrically to transmission line TX of the transmission circuit. Correspondingly, short-circuit strips 16 are located between pins 27 and 28 and also between pins 29 and 30 in order to connect reception line RX of the transmission circuit electrically to transmission line L1.

Figure 6B:
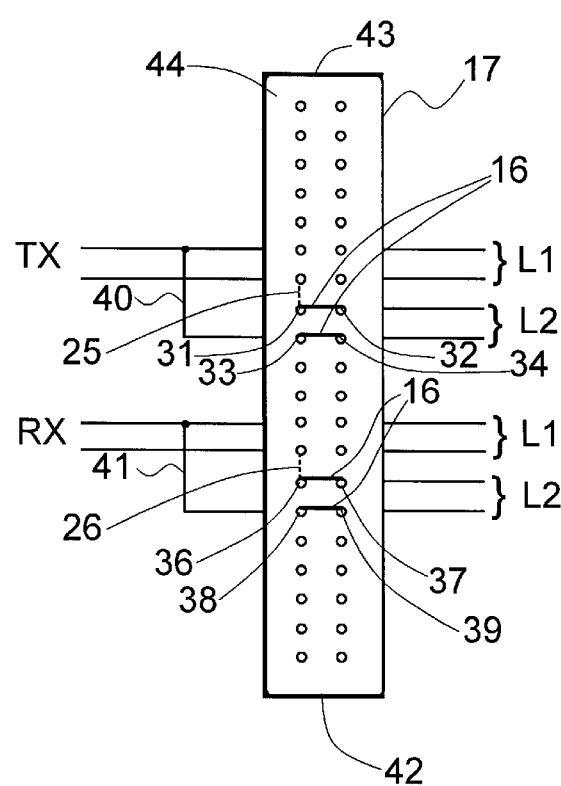

FIG. 6b shows the connection arrangement by way of example in its second operating position, whereby transmission line L2 is connected electrically to transmission line TX and to reception line RX of the transmission circuit. Transmission line TX and reception line RX of the transmission circuit as well as transmission lines L1 and L2 are connected to connection arrangement 17 in the manner presented above in connection with the description of FIG. 6a. That part of connection arrangement 17 which includes short-circuit strips 16 is turned through 180 degrees from the operating position shown in FIG. 6a so that surface 44 of the connection arrangement still points in the same direction and so that in the second operating position shown in FIG. 6b ends 42 and 43 of the connection arrangement are located in opposite locations than in the first operating position shown in FIG. 6a. Hereby, in the second operating position of connection arrangement 17 shown in FIG. 6b, short-circuit strips 16 are located to connect transmission line TX of the transmission circuit electrically to transmission line L2 by connecting the stretch between pins 31 and 32 as well as the stretch between pins 33 and 34 to be electrically conductive. Correspondingly, short-circuit strips 16 are located to connect reception line RX electrically to transmission line L2 by connecting the stretch between pins 36 and 37 as well as the stretch between pins 38 and 39 to be electrically conductive.

Figure 7:
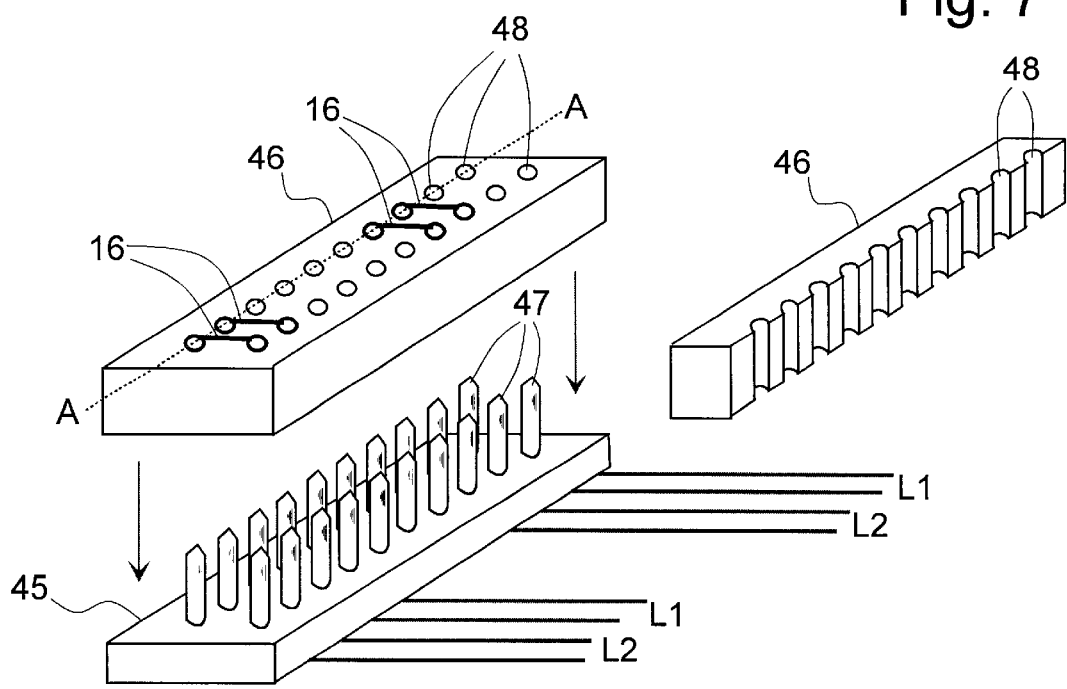
FIG. 7 shows the structure of a first embodiment of a counterpart in accordance with the invention.

FIG. 7 shows the structure of a first embodiment of the connection arrangement. The first embodiment of the connection arrangement includes a connector strip 45 and a counterpart 46 which can be attached to it. The two arrows shown in the figure show attachment of the counterpart 46 to the connector strip 45. Connector strip 45, in the example shown in FIG. 7 a pin head strip, is preferably attached to a circuit board of the transmission unit and it includes electrically conductive pins 47, to which transmission lines and transmission and reception lines are connected. For the sake of clarity, Figure shows only the connection of transmission lines L1 and L2 to the connector strip. In the first embodiment of the connection arrangement, counterpart 46 is a short-circuit piece including cavities 48 into which pins 47 of the pin strip will fit as well as short-circuit strips 16. Counter part piece 46 is preferably made of plastic and with a structure preferably shaped as a connector strip, in the case shown in FIG. 7 like a rectangular beam. At least in some cavities 48 a coating is mounted which is made of an electrically conductive material. In order to bring about the desired short-circuit connection between mutually electrically connectable cavities 48, a short circuit 16 made of an electrically conductive material is mounted that connects the electrically conductive coatings of the said cavities 48 with one another. Short-circuit strip 16 is preferably formed between the cavities through the whole depth of the cavities. At least those cavities 48 which are to be connected by the short-circuit strip 16 in order to bring about an electric connection must be coated on their inner surface with an electrically conductive material. In the right side of FIG. 7 a cross-section of the short-circuit piece 46 is shown in the direction of dashed line A—A. As is shown in the cross-section figure, cavities 48 are preferably formed through the whole short-circuit piece. Short-circuit connections are formed in the short-circuit piece in such a way that the same short-circuit pieces 16 in the first position of the short-circuit piece will connect one transmission line to the transmission circuit and in a second position, which is turned through 180 degrees in relation to the first position, the short-circuit piece will connect a second transmission line to the transmission circuit.

Figure 8:
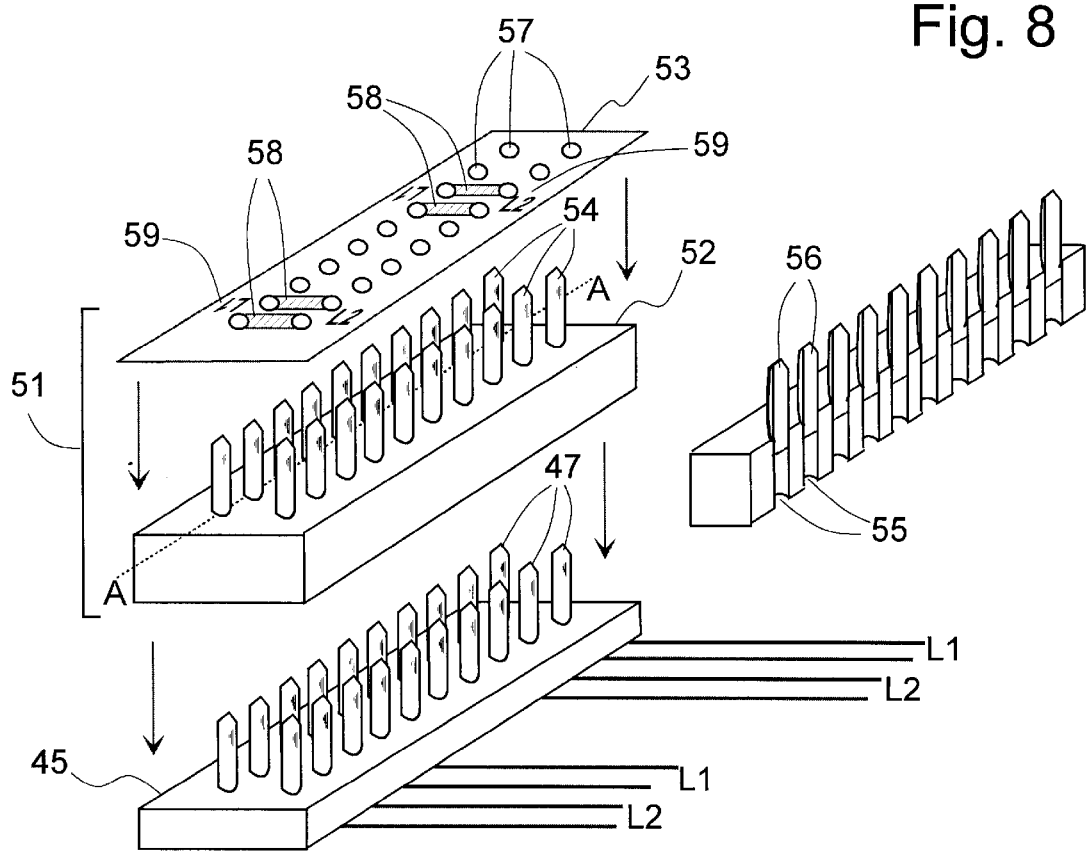
FIG. 8 shows the structure of a second embodiment of a counterpart in accordance with the invention.

FIG. 8 shows the structure of a second embodiment of the connection arrangement. The second embodiment of the connection arrangement includes a connector strip 45 and a counterpart 51 which can be attached to it. The arrows shown in the figure show how the structural parts of counterpart 51 and connector strip 45 are attached to one another. Connector strip 45 is like the one presented above in connection with the description of FIG. 7. Counterpart 51 includes a connection part 52 and a short-circuit board 53 with an essentially plate-like structure. The structure of connection part 52 is preferably of the same shape as connector strip 45, in the case shown in FIG. 8 a rectangular beam, and it includes connecting pins 54 whose side attaching to the connector strip 45 forms a cavity 55 while the side attaching to short-circuit board 53 forms a tap 56. Connecting pins 54 form an electric connection with pins 47 of the connector strip. Short-circuit board 53 for its part includes holes 57 and electrically conductive strips 58 to connect some holes electrically and thus also to connect chosen pins 47 of the connector strip electrically with one another when the connector strip 45 and the counterpart 51 are attached to each other. Strips 58 of the short-circuit board 53 may be embodied e.g. as a foil attached to the circuit board or as a surface mounted connection. It is another advantage of the second embodiment of the connection arrangement that markings 59 may be written in the short-circuit board to guide the person performing the connection. For example, in the case shown in FIG. 8, the name of that line which the short-circuit board will connect in its current operating position is marked on the short-circuit board 53 on the side of transmission lines.

In one embodiment, the counterpart of the connection arrangement includes just a short-circuit board which is preferably a circuit board of a stable structure. Hereby the short-circuit board is essentially like the short-circuit board 53 described above in connection with the second embodiment of the short-circuit board and it can be attached directly to connector strip 45.

In order to bring about a connection in accordance with one embodiment of the invention, counterpart 46 and 51 of the connection arrangement is attached to connector strip 45 either in its first operating position or in its second operating position which is turned through 180 degrees in relation to the first position. In the second embodiment of the connection arrangement, the entity formed by connection part 52 and short-circuit board 53 is thus turned when the connection is changed.

The counterpart of the connection arrangement may be essentially of the same length as the connector strip or it may be shorter. If the counterpart is shorter than the connector strip, the counterpart has not sufficient cavities for all pins of the connector strip. What is essential in the structure of the counterpart is that it can be unambiguously connected to the connector strip in both its operating positions, whereby there is no risk of any wrong connection in the connection arrangement. To ensure an unambiguous connection, one may e.g. mark the place for the counterpart in the connector strip.

The counterpart of the connection arrangement may connect several transmission lines simultaneously, e.g. connect different transmission lines simultaneously with different parts of the transmission circuit or, as was presented above in the described examples, connect a transmission line both to the transmission side Tx and to the reception side Rx of the transmission circuit. The counterpart can also be embodied in such a way that it will connect only one transmission line to one wiring of the circuit at a time.

The impedance match in accordance with the present invention is suitable especially for implementing an exact reception match, but it can also be used for matching a transmission circuit to a transmission line.

The drawings and their related explanation are only intended to illustrate the inventive idea. The details of the line controller circuit in accordance with the invention may vary within the scope of the claims. Although the invention was described above mainly in connection with an input impedance formed by a connection in parallel of combinations of three resistances, a connection in parallel of even more resistances can be used in the matching circuit, whereby it is possible to match several different transmission line characteristic impedances to the transmission circuit. The transmission line characteristic impedances presented above in connection with the description of the invention are only intended to illustrate the inventive idea. An impedance match in accordance with the invention may of course be suitable for use also for matching other characteristic impedance values than the ones presented in the foregoing.

What is claimed is:

1. Circuit arrangement for forming an impedance match of transmission lines, which circuit arrangement includes a control stage, a dynamic input impedance formed by resistances, and a transformer provided with primary and secondary coils, so that the control stage and the input impedance are connected to poles of the secondary coil of the transformer and respective transmission lines having first and second characteristic impedances are connected to poles of the primary coil of the transformer for implementation of a matcher and controller for controlling the implementation of the match, the arrangement comprising:

a connection arrangement through which said transmission lines having different characteristic impedances are connected to the poles of the transformer's primary coil, wherein the connection arrangement includes wires of a first set connected to the primary coils and wires of a second set connected to the transmission lines, the first set of wires includes at least a first and second twin wire, and a connector part with which wires of the first and second set are connected together, which connector part includes a connector strip mounted on a circuit board and a removable counterpart which is attached to the connector strip, the counterpart being symmetrical to the connector strip, wherein in a first position, the counterpart connects at least the wires of the first set with the transmission lines having the first impedance characteristic, and when the counterpart is rotated 180 degrees in relation to the first position the counterpart connects at least the wires of the first set with the transmission lines having the second impedance characteristic.

2. Circuit arrangement as defined in claim 1, wherein the connecter strip includes electric connection points to which the counterpart is attachable and the counterpart includes short-circuit strips to connect together the first and the second set of wires.

3. Circuit arrangement as defined in claim 2, wherein the counterpart includes marks to indicate which pair of the first set of wires is connected to which pair of the second set of wires depending on the position of the counterpart.

4. Circuit arrangement as defined in claim 1, wherein the controller is a processor for connecting the first and second set of wires.

* * * * *